(12) United States Patent
Jiang et al.

(10) Patent No.: US 11,860,191 B2
(45) Date of Patent: Jan. 2, 2024

(54) PROBE MODULE

(71) Applicant: SUZHOU HYC TECHNOLOGY CO., LTD., Jiangsu (CN)

(72) Inventors: Bin Jiang, Suzhou (CN); Yue Liu, Suzhou (CN); Hao Li, Suzhou (CN)

(73) Assignee: SUZHOU HYC TECHNOLOGY CO., LTD., Suzhou (CN)

( * ) Notice: Subject to any disclaimer, the term of this patent is extended or adjusted under 35 U.S.C. 154(b) by 312 days.

(21) Appl. No.: 17/608,144

(22) PCT Filed: Jun. 19, 2020

(86) PCT No.: PCT/CN2020/097085
§ 371 (c)(1),
(2) Date: Nov. 1, 2021

(87) PCT Pub. No.: WO2021/093330
PCT Pub. Date: May 20, 2021

(65) Prior Publication Data
US 2022/0229090 A1 Jul. 21, 2022

(30) Foreign Application Priority Data

Nov. 12, 2019 (CN) .......................... 201911100838.7
Nov. 12, 2019 (CN) .......................... 201911100843.8

(51) Int. Cl.
*G01R 1/07* (2006.01)
*G01R 1/073* (2006.01)

(52) U.S. Cl.
CPC .............................. *G01R 1/07307* (2013.01)

(58) Field of Classification Search
CPC ............ G01R 1/07307; G01R 1/07378; G01R 1/06733; G01R 1/07314; G01R 1/07371
See application file for complete search history.

(56) References Cited

U.S. PATENT DOCUMENTS

2004/0095157 A1* 5/2004 Sato .................... G01R 1/07371
324/756.01
2011/0204912 A1* 8/2011 Root .................. G01R 31/2886
29/830

(Continued)

FOREIGN PATENT DOCUMENTS

CN 207263798 U 4/2018
CN 208421011 U 1/2019

(Continued)

OTHER PUBLICATIONS

The international search report dated Sep. 27, 2020 in PCT Application No. PCT/CN2020/097085.

*Primary Examiner* — Alvaro E Fortich
(74) *Attorney, Agent, or Firm* — Kilpatrick Townsend & Stockton LLP

(57) ABSTRACT

The present disclosure discloses a probe module, comprising: a body, a floating plate located at the bottom of the body and a probe assembly located on the side of the body which is far away from the floating plate. The probe assembly includes a cover plate, a mould core comprising pin grooves and blade pins each limited and fixed in the pin groove by a limiting member. The floating plate comprises pin holes, and the floating plate is configured to be floatable relative to the body in an extension direction of the blade pin and electrical contact terminals of the blade pins may be inserted into the pin holes from the surface of the floating plate close to the body and protrude from the surface of the floating plate which is far away from the body.

10 Claims, 6 Drawing Sheets

(56) References Cited

U.S. PATENT DOCUMENTS

| | | | | |
|---|---|---|---|---|
| 2014/0239996 A1* | 8/2014 | Root | ............... | G01R 1/07307 324/756.03 |
| 2015/0168450 A1* | 6/2015 | Wooden | ............ | G01R 1/0466 324/756.02 |
| 2015/0233973 A1* | 8/2015 | Wooden | ............ | G01R 1/0441 29/876 |

FOREIGN PATENT DOCUMENTS

| | | |
|---|---|---|
| CN | 110716073 A | 1/2020 |
| CN | 110716074 A | 1/2020 |
| CN | 210514587 U | 5/2020 |
| KR | 101722403 B1 | 4/2017 |

\* cited by examiner

PROBE MODULE

FIELD OF THE DISCLOSURE

The present application relates to the field of testing devices, in particular to a probe module.

BACKGROUND OF THE DISCLOSURE

With the rapid development of the modern society, various electronic products enter people's lives and accordingly people have increasingly high requirements for the quality of the electronic products. Therefore, it needs to test semi-finished products in each stage of the process of producing the electronic products. Currently, the testing is generally performed by electrically connecting a testing apparatus to a product. A connector used in the testing apparatus is a metal probe for which a Pogo Pin (cylindrical pin) is mainly used. For the Pogo Pin, there is point contact between the Pogo Pin and the electronic product, which is apt to puncture the product. Furthermore, the Pogo pin also has many disadvantages such as a short service life, a large resistance and an unstable testing signal. At present, a flat blade pin is gradually replacing the Pogo Pin (cylindrical pin) and is widely used. There is linear contact between the blade pin and the electronic product, which has a larger contact area than the point contact. Therefore, the blade pin has a longer service life, a smaller resistance and a more stable testing signal, compared to the Pogo pin.

Currently, the blade pin which is mainly used in a testing device has some disadvantages, such as its complex structure and high cost. Besides, it is difficult to position the blade pin relative to a mould core quickly and accurately during assembly of the blade pin and the mould core, resulting in poor detection stability of the whole module. Moreover, it could not be ensured to accurately align the blade pin and the electrical terminal of the electronic product when the probe module is crimp-connected to the electronic product to be tested and the electrical conduction is established. Once there is a misalignment, the risk of damaging the tip of the blade pin might occur.

In addition, due to the structure design deficiencies of the existing probe module, it is impossible to replace the whole probe assembly. That is to say, if a probe, i.e., a blade pin body, is damaged and a repairman removes the cover plate to replace the blade pin body, he will find that blade pin bodies configured in the mould core are separate individuals and it is impossible to find or replace the damaged one. Furthermore, it is necessary to pour out all pin bodies configured in the pin groove because the mould core in the probe assembly is usually used to press a floating plate in order that the floating plate can be fixed to the body and accordingly the mould core with the pin bodies cannot be dismounted during replacement of the damaged pin body. During pouring-out of the pin bodies, there are two ways. One is to take the pin bodies out one by one, however, the process is cumbersome and inefficient, and it is easy to cause unnecessary friction damage to the mould core; the other way is to pour all pin bodies out at a time, however, the pin bodies are scattered, resulting in inconvenience to the replacement of the damaged pin body.

BRIEF SUMMARY OF THE DISCLOSURE

In view of the above problem, the problem to be solved by the present application is to provide a probe module structure that is easy to be assembled and convenient to replace a pin in the module.

To solve the above problem, embodiment of the present application are as follows: a probe module that includes a body having a hollow cavity, a floating plate located at the bottom of the body, and a probe assembly located on the side of the body which is far away from the floating plate; and the probe assembly includes a cover plate connected to and fixed on the top of the body, a mould core connected to and fixed on the bottom surface of the cover plate and located in the hollow cavity, and the mould core comprises pin grooves, and blade pins located in the hollow cavity and in one-to-one correspondence to the plurality of pin grooves, and each blade pin is limited and fixed in a pin groove by a limiting member. The floating plate includes pin holes in one-to-one correspondence to electrical contact terminals of the blade pins, and the floating plate is configured to be floatable relative to the body in an extension direction of the blade pin and the electrical contact terminals of the blade pins protrude from a surface of the floating plate which is far away from the body through the pin holes.

In one embodiment, the probe assembly further comprises a mould core fixing member located in the hollow cavity, and the mould core fixing member is sleeved outside the mould core and is connected to and fixed on the cover plate; and the mould core fixing member comprises recessed step portions which form the limiting member.

In one embodiment, the blade pin comprises a limiting edge corresponding to the step surfaces of the step portions, and the blade pin is limited and fixed in the pin groove of the mould core by means of cooperation between the step surfaces of the step portions and the limiting edge of the blade pin.

In one embodiment, the floating plate does not contact the mould core or the mould core fixing member when the floating plate is located at an extreme position close to the body.

In one embodiment, the body comprises a limiting portion which is formed by inward extension of the inner wall of the hollow cavity and configured to firmly fix the mould core fixing member between the body and the cover plate.

In one embodiment, the blade pin comprises a limiting edge and the limiting member is formed on the mould core, and the blade pin is limited and fixed in the pin groove of the mould core by means of the cooperation between the limiting member and the limiting edge.

In one embodiment, the mould core comprises a body portion provided with the pin grooves and a projection structure in the pin groove, and the projection structure is formed by protrusion of the body portion of the mould core and forms the limiting member.

In one embodiment, the mould core comprises a body portion provided with the pin grooves and a limiting surface formed on the body portion, and the limiting surface forms the limiting member.

In one embodiment, the floating plate does not contact the mould core when the floating plate is located at an extreme position close to the body.

In one embodiment, the body comprises a limiting portion formed by inward extension of the inner wall of the hollow cavity and configured to firmly fix the mould core between the body and the cover plate.

The beneficial effects of the present application are as follows:

Compared with the prior art, in the probe module provided by the present application, because the floating plate and the probe assembly are fixed on opposite two sides of the body respectively and pin grooves matching the blade pins are provided on the mould core, the blade pins can be mounted in the pin grooves in one-to-one correspondence, thus ensuring the assembly effectiveness. Furthermore, the overall structure is more compact and the stability of a testing process may be increased since the shape of the pin groove is consistent with the shape of the blade pin.

In the probe module structure provided by the present application, the probe assembly formed of the cover plate, the mould core, the blade pins and the limiting member constitutes an integral structure. Accordingly, the probe assembly as a whole can be replaced or the single blade pin in the probe assembly can be replaced when a blade pin is damaged. During replacement of the blade pin, the assembly accuracy of the floating plate and the body which are both components of the probe module is not affected, thus ensuring that the blade pins can be in one-to-one correspondence to the pin holes on the floating plate after the replacement of the probe assembly. Therefore, there is no need to further adjust the assembly accuracy, thus improving the working efficiency of replacing the pin of the probe module.

In addition, in the present application, by providing an enclosing wall surrounding the pin holes on the surface of the floating plate far away from the body, a product can be pre-positioned during a crimp-connection process, to ensure that the product is located directly under the blade pin, thus achieving accurate alignment between the blade pin and the product.

BRIEF DESCRIPTION OF THE DRAWINGS

The specific implementations of the present application are described in further details below with reference to the drawings.

DETAILED DESCRIPTION OF THE DISCLOSURE

Figure 1:
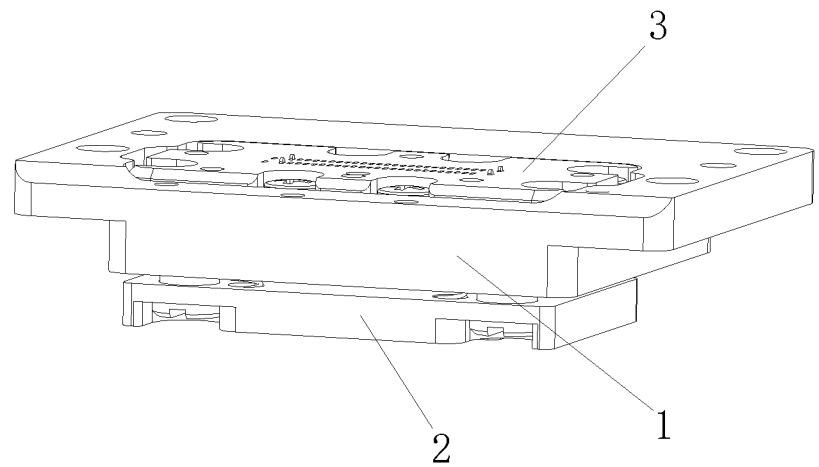
FIG. 1 illustrates a schematic diagram of an overall structure of a probe module provided by the first embodiment of the present disclosure.

Various exemplary embodiments of the present disclosure are described in detail below with reference to the drawings. It should be noted that unless otherwise stated, the relative arrangement of components and steps, numerical expressions and numerical values set forth in these embodiments do not limit the scope of the present disclosure.

The following description of at least one exemplary embodiment is actually illustrative only, and in no way serves as any limitation to the present disclosure and application or use thereof.

The technology and apparatus known in the art may not be discussed in detail, but when appropriate, the technology and apparatus should be regarded as part of the description.

In all examples shown and discussed herein, any specific value should be interpreted as exemplary only, rather than as a limitation. Therefore, other examples of the exemplary embodiment may have different values.

It should be noted that similar reference numerals and letters indicate similar items in the following drawings, and therefore, once an item is defined in one drawing, it does not need to be further discussed in the subsequent drawings.

It should be noted that, in the embodiments, a display module used in conjunction with the probe module provided by the present disclosure is used for exemplary description, but it does not mean that the probe module provided by the present disclosure can only be applied to the crimp-connection testing of the display modules, liquid crystal modules or other display devices.

It is not easy for the probe module to be assembled and it is not convenient for a pin in the module to be replaced due to the structure limitation of the existing probe module. In order to solve the problem, the present disclosure provides a probe module. Referring to FIGS. 1-5, the probe module includes a body 1 having a hollow cavity; a floating plate 2 located at the bottom of the body 1; and a probe assembly 3 located on the side of the body 1 which is far away from the floating plate 2.

The probe assembly 3 includes a cover plate 31 connected to and fixed on the top of the body 1; a mould core 32 connected to and fixed on the bottom surface of the cover plate 31 and located in the hollow cavity, and the mould core 32 comprises pin grooves 321; and blade pins 33 located in the hollow cavity and in one-to-one correspondence to the pin grooves 321, and each blade pin is limited and fixed in a corresponding pin groove 321 by a limiting member.

The floating plate 2 comprises pin holes 21 in one-to-one correspondence to electrical contact terminals 331 of the blade pins 33. The floating plate 2 is configured to be floatable relative to the body 1 in an extension direction of the blade pin 33 and the electrical contact terminals 331 of the blade pins 33 may protrude from a surface of the floating plate 2 which is far away from the body through the pin holes 21 (that is to say, the electrical contact terminals 331 of the blade pins 33 may be inserted into the pin holes 21 from the surface of the floating plate 2 close to the body 1 and protrude from the surface of the floating plate 2 which is far away from the body 1).

In the probe module provided by the present disclosure, the floating plate 2 and the probe assembly 3 are fixed on opposite two sides of the body 1 respectively, and the blade pins 33 are fixed in the pin grooves 321 by the limiting member, so that the probe assembly 3 formed by fixing the cover plate 31, the mould core 32 and the blade pins 33 with each other constitutes an integral structure. Accordingly, the probe assembly as a whole can be replaced or the single blade pin in the probe assembly can be replaced when a blade pin is damaged. During replacement of the probe assembly, the assembly accuracy of the floating plate and the body which are both components of the probe module is not affected, thus ensuring that the blade pins can be in one-to-one correspondence to the pin holes on the floating plate after the replacement of the probe assembly. Therefore, there is no need to further adjust the assembly accuracy, thus improving the working efficiency of replacing the pin of the probe module, facilitating pin maintenance and increasing the stability of a testing process.

In some embodiments, the present disclosure provides implementations for fixing the mould core 32, the blade pins 33 and the cover plate 31 together. In one embodiment, referring to FIG. 2, FIG. 3 and FIG. 4, the probe assembly 3 further comprises a mould core fixing member 34 located in the hollow cavity, and the mould core fixing member 34 is sleeved outside the mould core 32 and is connected and fixed to the cover plate 31; the mould core fixing member 34 comprises recessed step portions 341 which form the limiting member. Further, the blade pin 33 comprises a limiting edge 332 corresponding to the step surfaces of the step portions 341, and the blade pin 33 is limited and fixed in the pin groove 321 of the mould core 32 by means of cooperation between the step surfaces of the step portions 341 and the limiting edge 332 of the blade pin 33. On one hand, the mould core fixing member 34 can enclose the blade pins 33 to prevent the blade pins from dropping out of the pin groove. On the other hand, the recessed step portion 341 of the mould core fixing member 34 can firmly integrate the mould core 32 with the cover plate 31 at the bottom of the mould core 32 to form an integral structure, and by using the limiting member formed by the step portions 341, the blade pins 33 are limited and fixed in the pin groove 321 by means of the cooperation between the step surfaces of the step portions 341 and the limiting edge 332. It can be understood that there is a space left between the step portions 341 so that the electrical contact terminals 331 of the blade pins 33 may protrude from the surface of the floating plate 2 which is far away from the body 1 through the pin holes 21 (that is to say, the electrical contact terminals 331 of the blade pins 33 may be inserted into the pin holes 21 from the surface of the floating plate 2 close to the body 1 and protrude from the surface of the floating plate 2 which is far away from the body 1). In one embodiment, at least one positioning column 4 and at least one positioning hole 5 matching the positioning column 4 are provided between the mould core fixing member 34 and the cover plate 31. In an embodiment, the body 1 comprises a limiting portion which is formed by inward extension of the inner wall of the hollow cavity and configured to firmly fix the mould core fixing member 34 between the body 1 and the cover plate 31.

In the present disclosure, first, an initial assembly and positioning of the blade pins are realized by means of the mould core, and then a complete positioning of the blade pins is realized by means of the fixing of the mould core and the cover plate and the fixing of the mould core fixing member and the cover plate. The at least one positioning column and the at least one positioning hole matching each other between the mould core fixing member and the cover plate can ensure the assembly accuracy of the mould core fixing member and the cover plate. It can be understood that the at least one positioning column can be disposed on the cover plate or on the mould core fixing member and the at least one positioning hole opposite to the positioning column can be disposed on the mould core fixing member or the cover plate correspondingly. The at least one positioning column can be a separate member for which it is convenient to be subsequently replaced and assembled. However, it is merely illustrative but not limited in the present disclosure.

In some embodiments, the floating plate 2 is connected and fixed on the bottom surface of the body 1 by means of equal-height screws 6. At least one elastic member 7 is disposed between the floating plate 2 and the body 1 and the acting force direction of the at least one elastic member 7 is along the axial direction of the equal-height screws 6. The equal-height screw 6 comprises a screw connection portion at the head end for connecting and fixing the floating plate 2 to the body 1 and a guide portion at the rear end of the screw connection portion for guiding the floating of the floating plate 2. In addition, the elastic member 7 can be a spring or other elastic elements with the elastic reset ability, which is not limited herein. If the elastic member 7 is a spring, the spring can be arranged between the floating plate 2 and the bottom of the body 1. In another example, in order to ensure that the spring is subjected to uniform force and does not deform, the spring may be sleeved outside the equal-height screw to maintain the floating stability of the floating plate.

Figure 5:
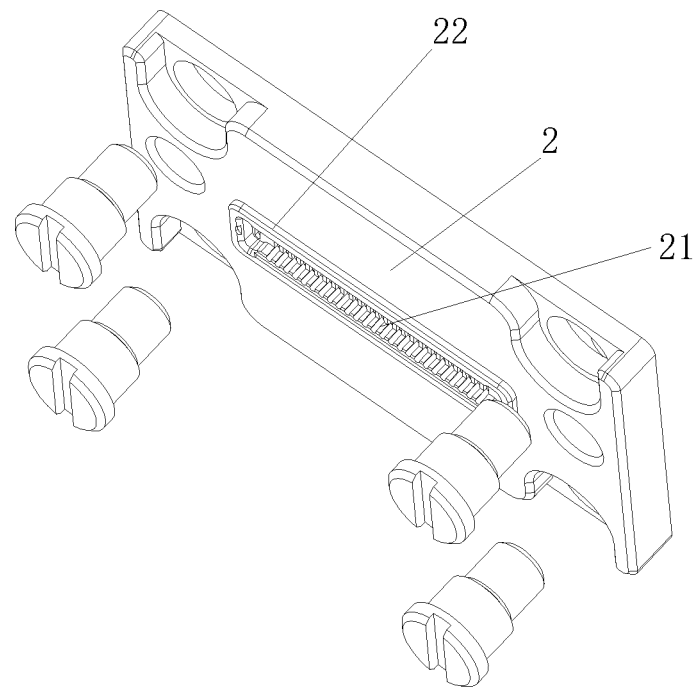
FIG. 5 illustrates a structural schematic diagram of a floating plate provided by the first embodiment of the present disclosure.
Figure 6:
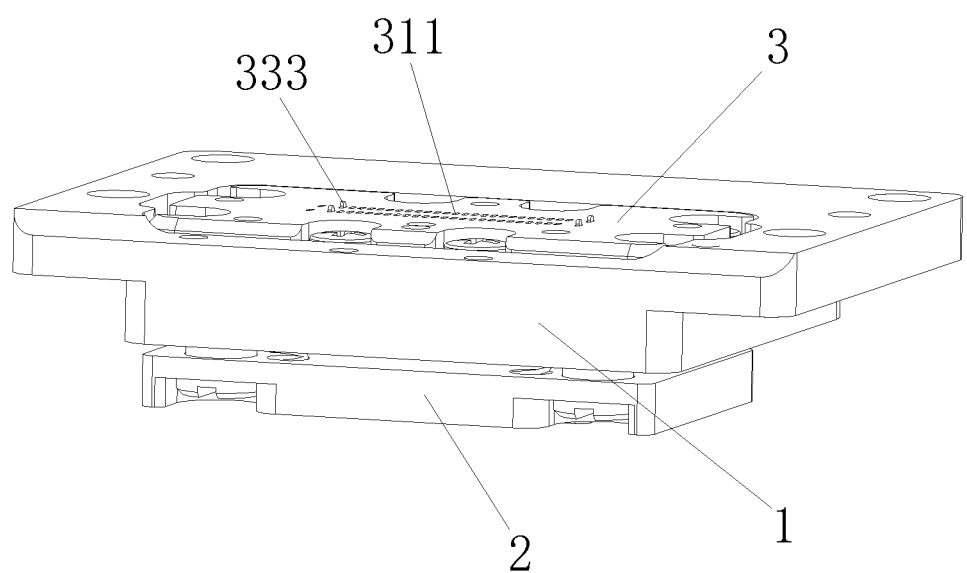
FIG. 6 illustrates a schematic diagram of an overall structure of a probe module provided by the second embodiment of the present disclosure.

Referring to FIG. 5, an enclosing wall 22 surrounding the pin holes 21 is further disposed on the surface of the floating plate 2 far away from the body 1. When the probe module is connected and fixed to a test structure to perform crimp-conduction for B2B and FPC of a display module, the enclosing wall 22 can provide a pre-positioning function to ensure that the electronic product to be tested is located directly under the blade pins, so that an electrical contact terminals of several blade pins can be in one-to-one correspondence to the electrical contact terminals of the product and thus accurately and stably crimp-connected to the electrical contact terminals to form electrical connections.

Figure 2:
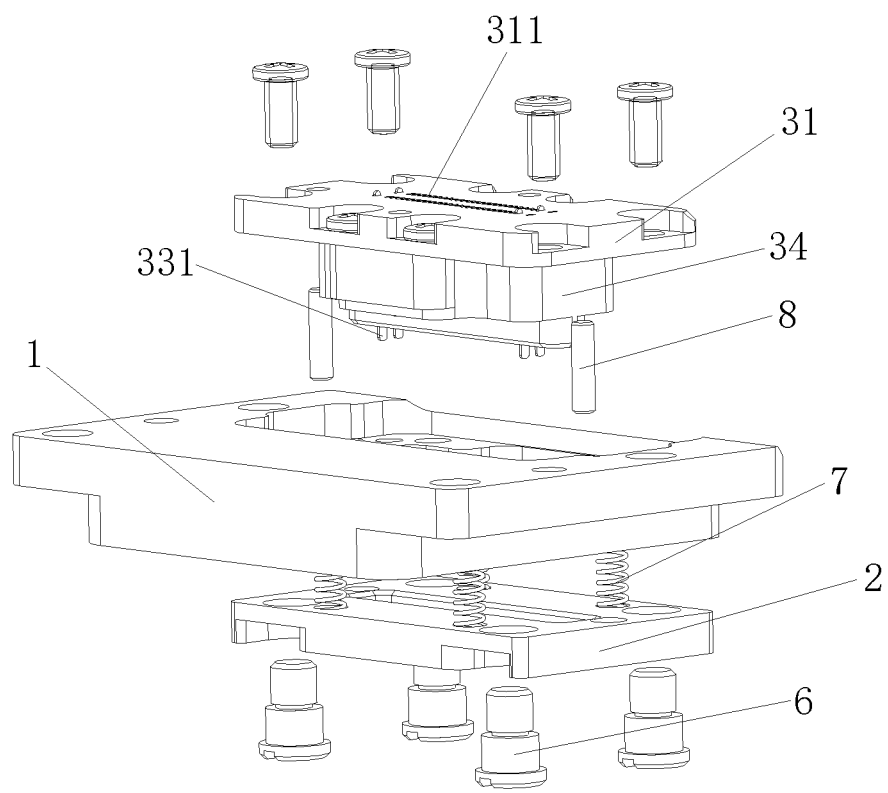
FIG. 2 illustrates an assembly diagram of the probe module provided by the first embodiment of the present disclosure.
Figure 3:
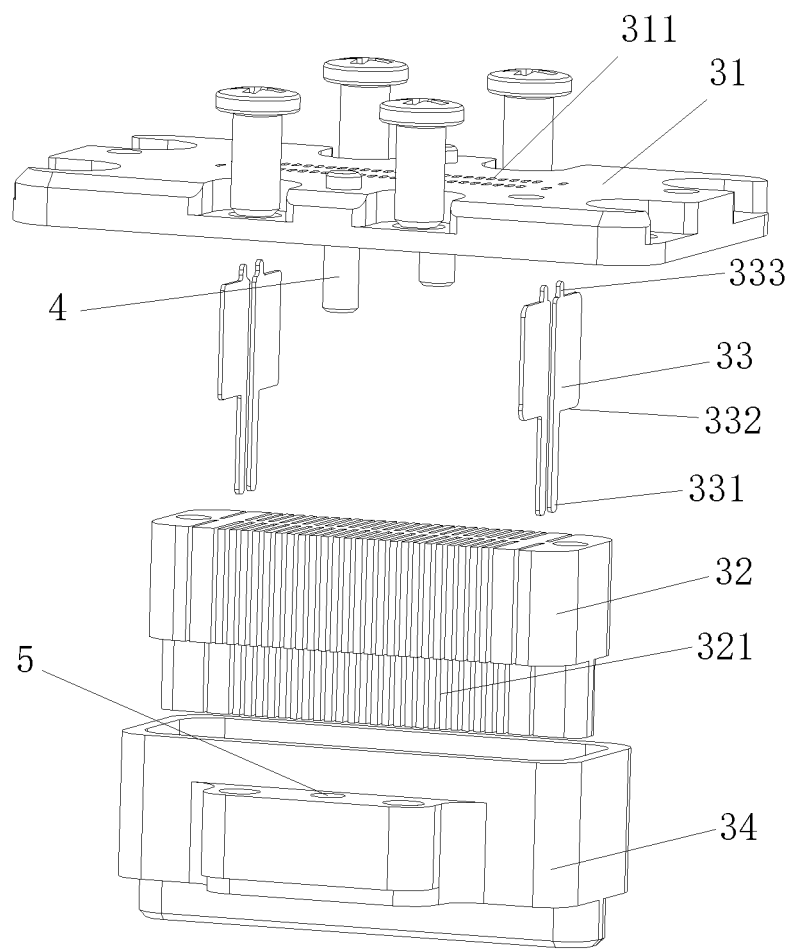
FIG. 3 illustrates an assembly diagram of a probe assembly provided by the first embodiment of the present disclosure.
Figure 4:
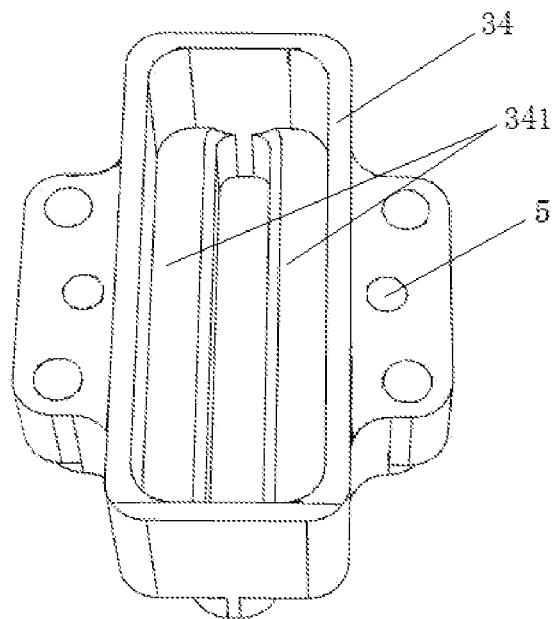
FIG. 4 illustrates a structural schematic diagram of a mould core fixing member provided by the first embodiment of the present disclosure.

In one embodiment, referring to FIG. 2, at least one positioning pin 8 and at least one positioning pin hole matching the positioning pin 8 are provided between the body 1 and the cover plate 31, to ensure the assembly accuracy of the integral structure formed of the body and the probe assembly.

In one embodiment, referring to the structure shown in FIGS., the cover plate 31 comprises positioning pin holes 311 corresponding to the head ends 333 of the blade pins 33 which is far away from the electrical contact terminals 331, to further ensure the positioning accuracy when assembling the blade pins 33.

In the embodiments as shown in FIGS. 1-5, in order to avoid collision between the floating plate 2 and the mould core 32 or the mould core fixing member 34 that might cause shaking of the blade pins 33 and thus affect the connection accuracy of the blade pins 33, the floating plate 2 does not contact the mould core 32 or the mould core fixing member 34 when the floating plate 2 is located at an extreme position close to the body 1 (i.e. the nearest position to the body 1).

In practical applications, the probe module provided by the present disclosure is connected and fixed to the test structure to perform a crimp-connection testing on the B2B and FPC of the display module. In an initial stage, the floating plate is in a bounced status, that is, the floating plate is located at a position far away from the body. In the stage, the electrical contact terminals of the blade pins are hidden in the floating plate to protect the blade pins. In the testing stage, the probe module is crimp-connected to the B2B or FPC, the floating plate is retracted under force and moves to the body. Hence, the electrical contact terminals of the blade pins are exposed from the surface of the floating plate which is far away from the body and contacts the B2B or FPC, so that signal conduction may be realized and then the testing may be completed by means of other device.

It is not easy for the probe module to be assembled and it is not convenient for a pin in the module to be replaced due to the structure limitation of the existing probe module. In order to solve the problem, the present disclosure further provides another probe module different from that disclosed in the first embodiment. Referring to FIGS. 6-9, the probe module includes a body 1 having a hollow cavity; a floating plate 2 located at the bottom of the body 1, and a probe assembly 3 located on the side of the body 1 which is far away from the floating plate 2.

The probe assembly 3 includes a cover plate 31 connected to and fixed on the top of the body 1; a mould core 32 connected to and fixed on the bottom surface of the cover plate 31 and located in the hollow cavity, and the mould core 32 comprises pin grooves 321; and blade pins 33 located in the hollow cavity and in one-to-one correspondence to the plurality of pin grooves 321, and each blade pin is fixed in the corresponding pin groove 321 by a limiting member.

The floating plate 2 comprises pin holes 21 corresponding to electrical contact terminals 331 of the blade pins 33. The floating plate 2 is configured to be floatable relative to the body 1 in an extension direction of the blade pin 33 and the electrical contact terminals 331 of the blade pins 33 may protrude from the surface of the floating plate 2 which is far away from the body 1 through the pin holes 21 (that is to say, the electrical contact terminals 331 of the blade pins 33 may be inserted into the pin holes 21 from the surface of the floating plate 2 close to the body 1 and protrude from the surface of the floating plate 2 which is far away from the body 1). Similar to that of the first embodiment, in the probe module provided by the present disclosure, the floating plate and the probe assembly are fixed on opposite two sides of the body 1 respectively, and the pin grooves matching the blade pins are disposed on the mould core, so that the plurality of blade pins can be mounted in the pin grooves in one-to-one correspondence, thus ensuring the assembly effectiveness. Since the shape of the pin groove is consistent with the shape of the blade pin, the overall structure is more compact, thus increasing the stability of a testing process.

In this embodiment, compared with the probe module in the first embodiment, each blade pin includes a limiting edge 332, and the limiting member is formed on the mould core 32. The blade pin 33 is limited and fixed in the pin groove 321 of the mould core 32 by means of the cooperation between the limiting member and the limiting edge 332. In the probe module provided by the present disclosure, the floating plate 2 and the probe assembly 3 are fixed on opposite two sides of the body 1 respectively, and the blade pins 33 are fixed in the pin grooves 321 by the limiting member, so that the probe assembly 3 formed by fixing the cover plate 31, the mould core 32 and the blade pins 33 with each other constitutes an integral structure. Accordingly, the probe assembly as a whole can be replaced when a blade pin is damaged. During replacement of the probe assembly, the assembly accuracy of the floating plate and the body which are both components of the probe module is not affected, thus ensuring that the blade pins can be in one-to-one correspondence to the pin holes on the floating plate after the replacement of the probe assembly. Therefore, there is no need to further adjust the assembly accuracy, thus improving the working efficiency of replacing the pin of the probe module, facilitating pin maintenance and increasing the stability of a testing process.

Figure 8:
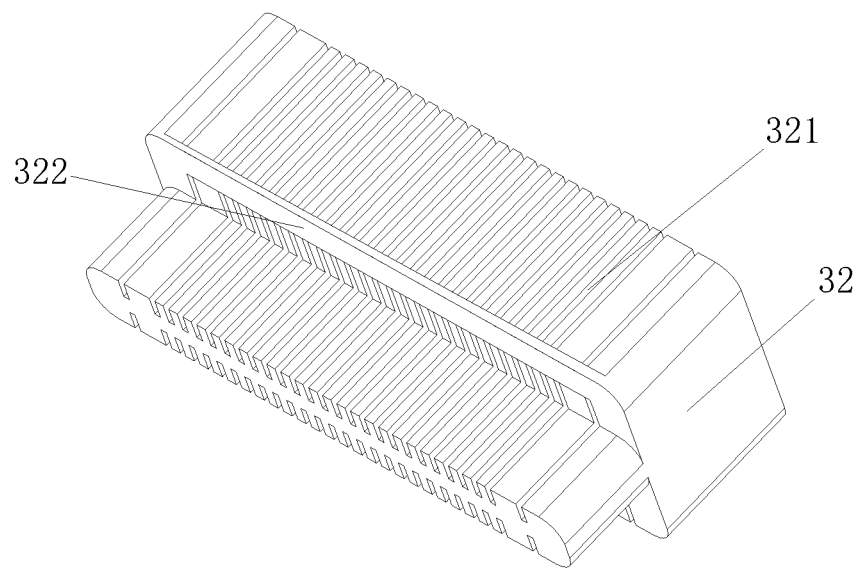
FIG. 8 illustrates a structural schematic diagram of a mould core in the probe module provided by the second embodiment of the present disclosure.

In some embodiments, referring to FIG. 8, the mould core 32 comprises a body portion provided with the plurality of pin grooves 321 and a limiting surface 322 formed on the lower surface of the body portion which forms the limiting member, so that the limiting edge 332 of the blade pin 33 can be hung on the inner surface of the limiting surface 322, thus realizing the fixing of the blade pins 33 in the pin grooves 321 by the limiting member. It can be understood that the limiting surface 322 should be provided with openings through which the electrical contact terminals 331 of the blade pins 33 pass, so that the electrical contact terminal 331 of the blade pin 33 may protrude from the surface of the floating plate 2 which is far away from the body 1 through the pin holes 21 (that is to say, the electrical contact terminals 331 of the blade pins 33 may be inserted into the pin holes 21 from the surface of the floating plate 2 close to the body 1 and protrude from the surface of the floating plate 2 which is far away from the body 1).

In one embodiment, the blade pin comprises a limiting edge and the limiting member is formed in the pin groove of the mould core. The blade pin is fixed in the pin groove of the mould core by means of cooperation between the limiting member and the limiting edge. In one embodiment, the mould core comprises a body portion provided with the plurality of pin grooves and a projection structure in each pin groove. The projection structure is formed by protrusion of the body portion of the mould core and the projection structure forms the limiting member, so that the limiting edge of the blade pin can be hung on the projection structure, thus realizing the fixing of the blade pin in the pin groove by the limiting member.

On the basis of the above structure, in some embodiments, at least one positioning column and at least one positioning hole matching the positioning column are provided between the mould core 3 and the cover plate 31. In this embodiment, first, an initial assembly and positioning of the blade pins 33 are realized by means the pin grooves 321 of the mould core 32, and then a complete positioning of the blade pins is realized by means of the fixing of the mould core 32 and the cover plate 31 and the cooperation between the limiting edge 332 of the blade pin 33 and the limiting surface 322 of the mould core 32. The positioning column and positioning hole matching each other between the mould core 32 and the cover plate 31 can ensure the assembly accuracy of the mould core 32 and the cover plate 31. It can be understood that the positioning column can be disposed on the cover plate or on the mould core and the positioning hole opposite to the positioning column can be disposed on the mould core or the cover plate correspondingly. The positioning column can be a separate member for which it is convenient to be subsequently replaced and assembled. However, it is merely illustrative but not limited in the present disclosure.

In one embodiment, the floating plate 2 is connected to and fixed on the bottom surface of the body 1 by means of equal-height screws 6. At least one elastic member 7 is disposed between the floating plate 2 and the body 1 and the acting force direction of the elastic member 7 is along the axial direction of the equal-height screws 6. The equal-height screw 6 comprises a screw connection portion at the head end for connecting and fixing the floating plate 2 to the body 1 and a guide portion at the rear end of the screw connection portion for guiding the floating of the floating plate 2. In addition, the elastic member 7 can be a spring or other elastic elements with the elastic reset ability, which is not limited herein. If the elastic member 7 is a spring, the spring can be arranged between the floating plate 2 and the bottom of the body 1. In another example, in order to ensure that the spring is subjected to uniform force and does not deform, the spring may be sleeved outside the equal-height screw to maintain the floating stability of the floating plate.

Figure 9:
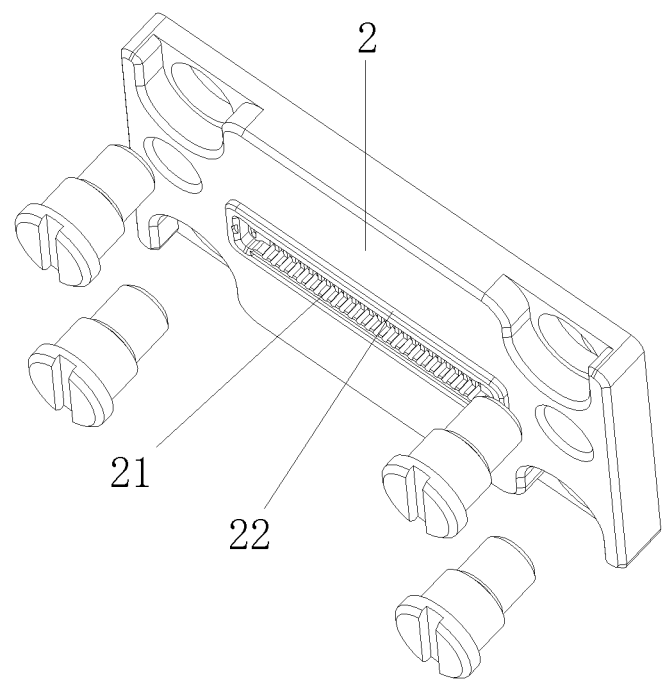
FIG. 9 illustrates a structural schematic diagram of a floating plate in the probe module provided by the second embodiment of the present disclosure.

Referring to FIG. 9, an enclosing wall 22 surrounding the pin holes 21 is further disposed on the surface of the floating plate 2 far away from the body 1. When the probe module is connected and fixed to a test structure to perform crimp-conduction for B2B and FPC of a display module, the enclosing wall 22 can provide a pre-positioning function to ensure that an electronic product to be tested is located directly under the blade pins, so that the electrical contact terminals of several blade pins can be in one-to-one correspondence to the electrical connection terminals of the product and thus accurately and stably crimp-connected to electrical contact terminals to form electrical connections.

Figure 7:
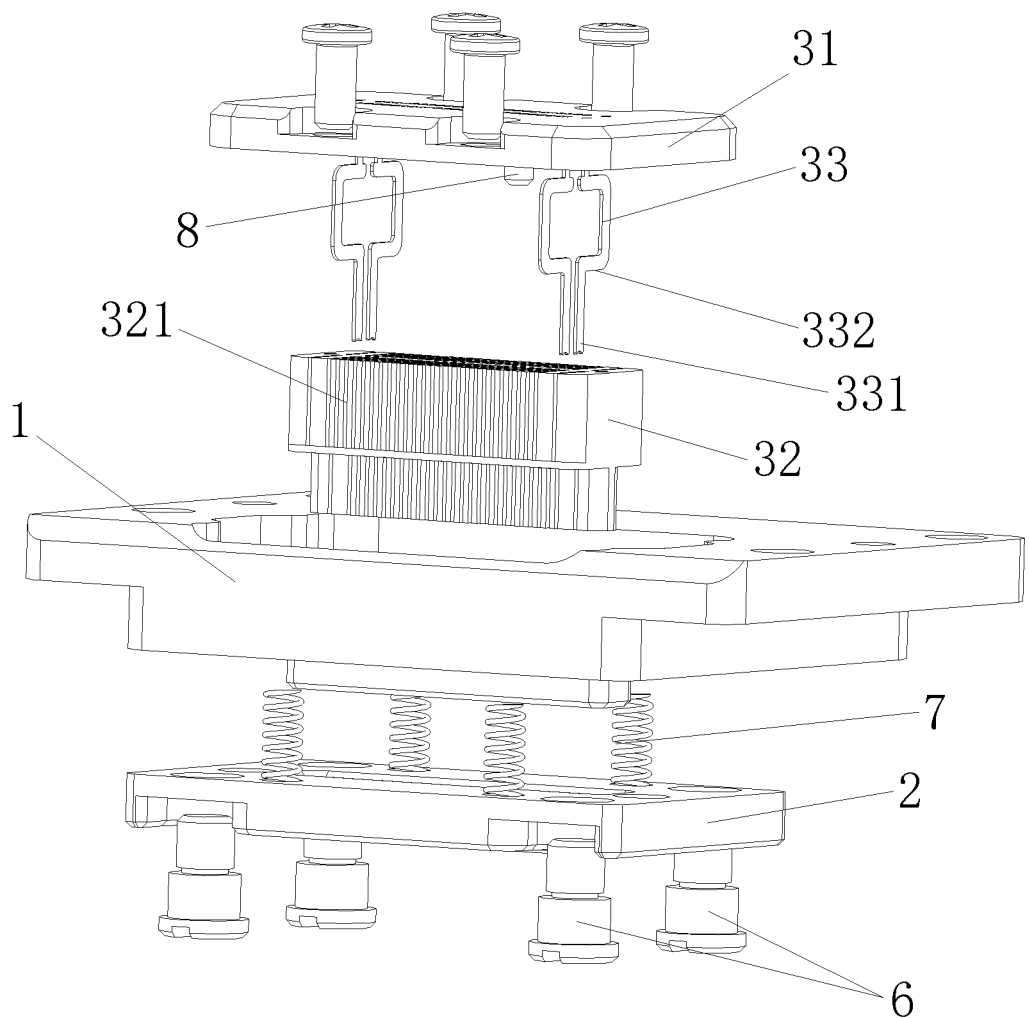
FIG. 7 illustrates an assembly diagram of the probe module provided by the second embodiment of the present disclosure.

In some embodiments, referring to FIG. 7, at least one positioning pin 8 and at least one positioning pin hole matching the positioning pin 8 are provided between the body 1 and the cover plate 31, to ensure the assembly accuracy of the integral structure formed of the body and the probe assembly.

In one embodiment, referring to the structure shown in FIGS., the cover plate 31 comprises a positioning pin holes 311 corresponding to the head ends 333 of the blade pins 33 which is far away from the electrical contact terminals 331, to further ensure the positioning accuracy when assembling the blade pins 33. In addition, in order to avoid collision between the floating plate and the mould core that might cause shaking of the blade pins and thus affect the connection accuracy of the blade pins, in some embodiments, the floating plate 2 does not contact the mould core 32 when the floating plate 2 is located at an extreme position close to the body 1.

In practical applications, the probe module provided by the present disclosure is connected and fixed to the test structure to perform a crimp-connection testing on the B2B and FPC of the display module. In an initial stage, the floating plate is in a bounced status, that is, the floating plate is located at a position far away from the body. In the stage, the electrical contact terminals of the blade pins are hidden in the floating plate to protect the blade pins. In the testing stage, the probe module is crimp-connected to the B2B or FPC, the floating plate is retracted under force and moves to the body. Hence, the electrical contact terminals of the blade pins are exposed from the surface of the floating plate which is far away from the body and contacts the B2B or FPC, so that signal conduction may be realized and then the testing may be completed by means of other device.

The above embodiments of the present disclosure are merely examples provided to illustrate the present disclosure, and are not intended to limit the implementation of the present disclosure. Other changes or modifications in different forms on the basis of the above description may be made. It is impossible to list all the implementations herein. Any changes or modifications derived from the embodiments of the present disclosure still fall within the protection scope of the present disclosure.

What is claimed is:

1. A probe module comprising:
a body having a hollow cavity;
a floating plate located at a bottom of the body; and
a probe assembly located on a side of the body located at a greatest distance away from the floating plate;
wherein the probe assembly comprises:
a cover plate connected to and fixed on a top of the body;
a mould core connected to and fixed on a bottom surface of the cover plate and located in the hollow cavity, wherein the mould core comprises a plurality of pin grooves; and
a plurality of blade pins located in the hollow cavity and in one-to-one correspondence to the plurality of pin grooves, wherein each blade pin is limited and fixed in a pin groove of the plurality of pin grooves by a limiting member;
and wherein the floating plate comprises:
a plurality of pin holes in one-to-one correspondence to electrical contact terminals of the blade pins, wherein the floating plate is configured to be floatable relative to the body in an extension direction of each blade pin and the electrical contact terminals of the blade pins are capable of protruding from a surface of the floating plate located at a greatest distance away from the body through the pin holes.

2. The probe module according to claim 1, wherein the probe assembly further comprises a mould core fixing member located in the hollow cavity, wherein the mould core fixing member is sleeved outside the mould core and is connected to and fixed on the cover plate; and
the mould core fixing member comprises recessed step portions which form the limiting member.

3. The probe module according to claim 2, wherein each blade pin comprises a limiting edge corresponding to step surfaces of the step portions, and each blade pin is limited and fixed in the pin groove of the plurality of pin groves of the mould core by means of cooperation between the step surfaces of the step portions and the limiting edge of the blade pin.

4. The probe module according to claim 2, wherein the floating plate does not contact the mould core or the mould core fixing member when the floating plate is located at an extreme position close to the body.

5. The probe module according to claim 2, wherein the body comprises a limiting portion which is formed by inward extension of an inner wall of the hollow cavity and configured to firmly fix the mould core fixing member between the body and the cover plate.

6. The probe module according to claim 1, wherein each blade pin comprises a limiting edge and the limiting member is formed on the mould core, wherein each blade pin is limited and fixed in the pin groove the plurality of pin groves of the mould core by means of the cooperation between the limiting member and the limiting edge.

7. The probe module according to claim 6, wherein the mould core comprises a body portion provided with the plurality of pin grooves and a projection structure in the pin groove, wherein the projection structure is formed by protrusion of the body portion of the mould core and forms the limiting member.

8. The probe module according to claim 6, wherein the mould core comprises a body portion provided with the plurality of pin grooves and a limiting surface formed on the body portion, wherein the limiting surface forms the limiting member.

9. The probe module according to claim 6, wherein the floating plate does not contact the mould core when the floating plate is located at an extreme position close to the body.

10. The probe module according to claim 6, wherein the body comprises a limiting portion formed by inward extension of the inner wall of the hollow cavity and configured to firmly fix the mould core between the body and the cover plate.

* * * * *